(12) United States Patent
Sethi

(10) Patent No.: US 12,145,408 B2
(45) Date of Patent: Nov. 19, 2024

(54) POWER DISTRIBUTION SYSTEM MOUNTABLE ON A VEHICLE WHEEL

(71) Applicant: TDK Corporation, Tokyo (JP)

(72) Inventor: Rakesh Sethi, San Jose, CA (US)

(73) Assignee: TDK CORPORATION, Tokyo (JP)

( * ) Notice: Subject to any disclaimer, the term of this patent is extended or adjusted under 35 U.S.C. 154(b) by 336 days.

(21) Appl. No.: 17/852,915

(22) Filed: Jun. 29, 2022

(65) Prior Publication Data

US 2022/0410641 A1 Dec. 29, 2022

Related U.S. Application Data

(60) Provisional application No. 63/216,476, filed on Jun. 29, 2021.

(51) Int. Cl.
*B60C 19/00* (2006.01)
*B60C 23/04* (2006.01)
*H02N 2/18* (2006.01)

(52) U.S. Cl.
CPC .......... *B60C 19/00* (2013.01); *B60C 23/0447* (2013.01); *H02N 2/186* (2013.01); *B60C 2019/004* (2013.01)

(58) Field of Classification Search
CPC . B60C 19/00; B60C 2019/04; B60C 23/0447; B60C 23/0491; B60C 23/04985; H02N 2/186
See application file for complete search history.

(56) References Cited

U.S. PATENT DOCUMENTS

| | | | | |
|---|---|---|---|---|
| 1,797,545 | A * | 3/1931 | Churcher | B60C 19/08 310/90 |
| 3,181,118 | A * | 4/1965 | Perry | B60C 23/08 200/61.23 |
| 3,593,269 | A * | 7/1971 | Richardson | B60C 23/06 200/61.23 |
| 3,760,351 | A * | 9/1973 | Thomas | B60C 23/08 340/447 |
| 6,291,901 | B1 * | 9/2001 | Cefo | H02K 35/02 322/3 |

(Continued)

FOREIGN PATENT DOCUMENTS

EP 2186657 A1 5/2010

OTHER PUBLICATIONS

Extended European Search Report issued in related European Patent Application No. 22207708.3 dated Apr. 4, 2023.

*Primary Examiner* — Jill E Culler
(74) *Attorney, Agent, or Firm* — Morgan, Lewis & Bockius LLP

(57) ABSTRACT

Electrical connectors mountable on wheels are described. An electrical connector may include a sleeve sized for mounting on a barrel of a wheel. The sleeve defines one or more channels. The electrical connector may also include one or more hollow spokes mechanically coupled with the sleeve, and one or more electrical conductors. An electrical conductor extends from a portion of the sleeve corresponding to a bead seat region through the one or more channels and a hollow spoke for electrically coupling with an electrical module positioned on a tread region of a tire mounted on the wheel. Electrical devices including such electrical connectors and electrical devices including other electrical connectors are also described.

18 Claims, 14 Drawing Sheets

(56) References Cited

U.S. PATENT DOCUMENTS

| | | | |
|---|---|---|---|
| 6,339,956 B1 | 1/2002 | Huinink et al. | |
| 10,035,385 B2 * | 7/2018 | Fontaine | B60C 23/0411 |
| 2010/0274607 A1 | 10/2010 | Carresjo et al. | |
| 2011/0308683 A1 | 12/2011 | Crano | |
| 2020/0049581 A1 | 2/2020 | Thornham et al. | |

* cited by examiner

POWER DISTRIBUTION SYSTEM MOUNTABLE ON A VEHICLE WHEEL

TECHNICAL FIELD

This application relates generally to electrical connectors, and more particularly to electrical connectors mountable to vehicle tires, rims, and wheels.

BACKGROUND

Advances in automotive sensing technologies have improved the safety and performance of automotive vehicles, which has led to a greater demand for advanced sensing applications to complement the existing electronic safety systems.

SUMMARY

Such demand has led to measurements of temperature, pressure, acceleration, and forces (static and dynamic) exerted on tires, wheels, and automotive vehicles. However, many of these sensors require electrical power for operation and data transmission. In addition, frequent measurements (and transmission) of data have increased an amount of power required for such sensors. Energy storage devices (e.g., lithium ion batteries) have a limited capacity and often present challenges associated with low durability, difficulty of replacement, and inferior sustainability. Such energy storage devices are typically subjected to accelerated discharge cycles, resulting in frequent or premature replacement of entire sensor modules, thereby increasing the overall cost of ownership and maintenance for the automotive vehicle.

The devices and methods described herein address challenges associated with conventional devices and methods for providing electrical power to sensor modules. Utilizing an energy-harvesting device (e.g., an electrical power generator that converts kinetic, thermal, optical, and mechanical energy available from the automotive vehicle, such as rotation, acceleration, deceleration, and/or vibration, of the wheels, into electrical energy) may replace conventional energy storage devices or, when used in conjunction, prolong the life expectancy of such energy storage devices. Such energy-harvesting devices are typically mounted where the source energy (e.g., kinetic, thermal, optical, or mechanical energy) is readily available (e.g., adjacent to a bead area of a tire mounted in a wheel). The disclosed electrical connectors allow electrical connection between an energy harvesting device mounted adjacent to a bead region of a tire and sensors mounted adjacent to a tread region of the tire, thereby allowing the energy-harvesting device to be placed at a location that is advantageous for energy harvesting, while allowing sensors located adjacent to the tread region of the tire to receive electrical power from the energy-harvesting device. Additionally or alternatively, the disclosed electrical connectors may allow communication of electrical signals between the sensors mounted adjacent to the tread region of the tire to one or more control modules located adjacent to the wheel, thereby enabling further processing (e.g., wireless transmission) of the sensor signals while allowing the control modules to be placed at a secure location.

In accordance with some embodiments, an electrical connector includes a sleeve sized for mounting on a barrel of a wheel. The sleeve defines one or more channels. A first side of the sleeve extends at least to a first bead seat region of the wheel. The electrical connector includes one or more hollow spokes mechanically coupled with the sleeve, and one or more electrical conductors. At least a first electrical conductor of the one or more electrical conductors extends from a first portion of the sleeve corresponding to the first bead seat region through the one or more channels and a first hollow spoke of the one or more hollow spokes for electrically coupling with a first electrical module positioned on a first tread region of a tire mounted on the wheel.

In accordance with some embodiments, an electrical device includes any electrical connector described herein and one or more energy harvesters, including a first energy harvester electrically coupled with the first electrical conductor.

In accordance with some embodiments, an electrical device includes any electrical connector described herein and the first electrical module electrically coupled with the first conductor.

In accordance with some embodiments, an electrical device includes any electrical connector described herein and a control module mounted on the sleeve. The control module includes one or more processors electrically coupled with at least one electrical conductor of the one or more electrical conductors.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

DESCRIPTION OF EMBODIMENTS

Reference will be made to embodiments, examples of which are illustrated in the accompanying drawings. In the following description, numerous specific details are set forth in order to provide a thorough understanding of the various described embodiments. However, it will be apparent to one of ordinary skill in the art that the various described embodiments may be practiced without these particular details. In other instances, methods, procedures, components, circuits, and networks that are well-known to those of ordinary skill in the art are not described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first electrical conductor could be termed a second electrical conductor, and, similarly, a second electrical conductor could be termed a first electrical conductor, without departing from the scope of the various described embodiments. The first electrical conductor and the second electrical conductor are both electrical conductors, but they are not the same electrical conductor.

The terminology used in the description of the embodiments herein is for the purpose of describing particular embodiments only and is not intended to be limiting of the scope of claims. As used in the description and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1A:
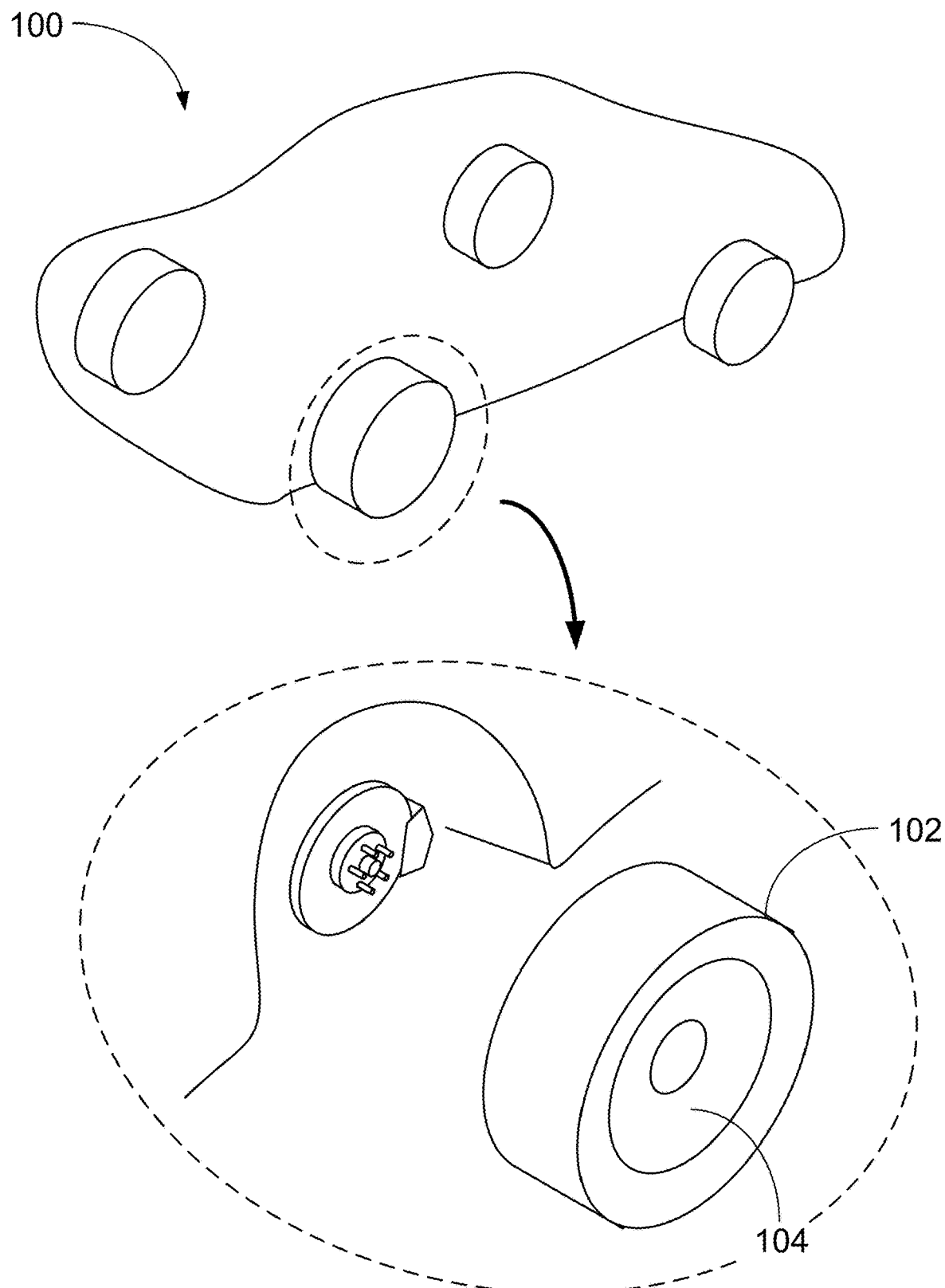
FIG. 1A is a schematic diagram illustrating parts of an automobile in accordance with some embodiments.

FIG. 1A is a schematic diagram illustrating parts of an automobile 100 (also called herein a vehicle or an automotive vehicle) in accordance with some embodiments. In some embodiments, the automobile 100 includes a wheel 104 and a tire 102 mounted on the wheel 104.

Figure 1B:
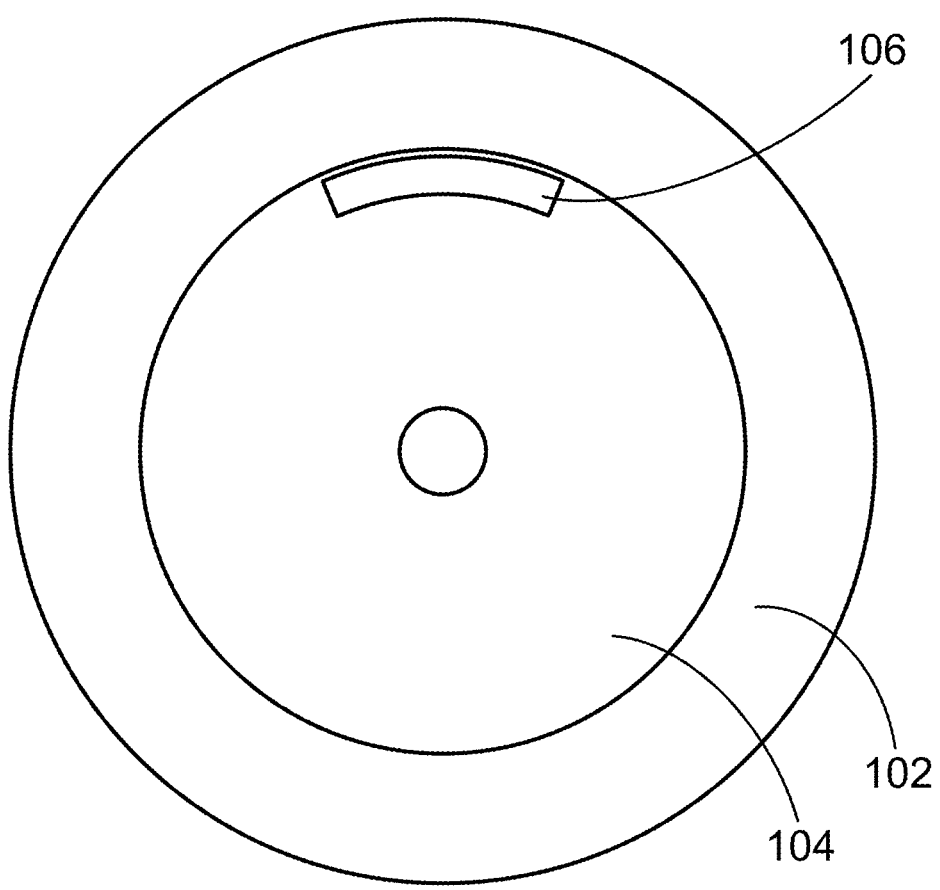
FIG. 1B is a schematic diagram illustrating an energy-harvesting device mounted on a wheel in accordance with some embodiments.

FIG. 1B is a schematic diagram illustrating an energy-harvesting device 106 (also called energy harvester or energy generator) mounted on a wheel 104 in accordance with some embodiments. In FIG. 1B, the energy-harvesting device 106 is positioned adjacent to a rim of the wheel 104. Positioning of the energy-harvesting device 106 adjacent to the rim of the wheel 104 is advantageous for energy-harvesting devices that utilize the centrifugal force, its variation, and/or associated vibration for energy harvesting (e.g., converting kinetic, mechanical energy into electrical energy). Although FIG. 1B shows only one energy-harvesting device 106 mounted on the wheel 104, in some embodiments, two or more energy-harvesting devices are mounted on the wheel 104.

Figure 1C:
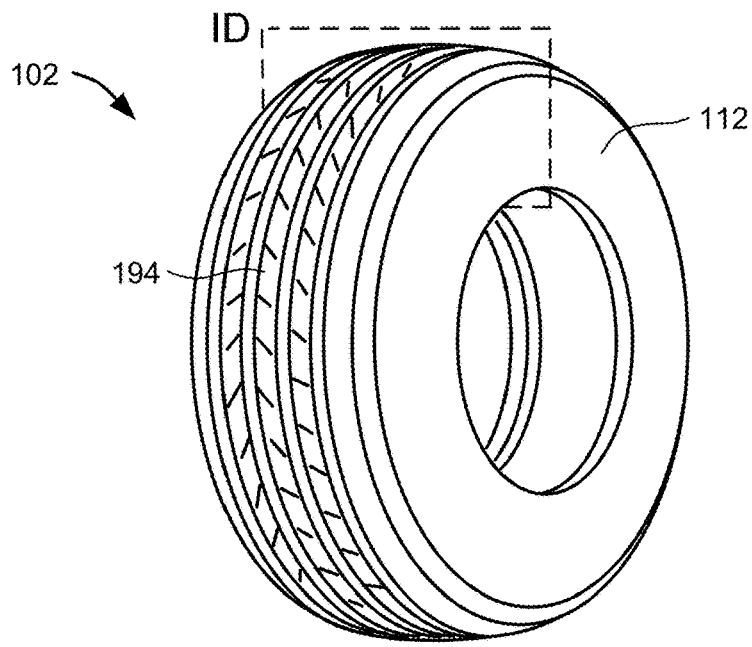
FIG. 1C illustrates a tire in accordance with some embodiments.

FIG. 1C illustrates a tire 102 in accordance with some embodiments. The tire 102 has a side wall 112 and a tread region 194 on which electrical connectors may be mounted to electrically connect an energy-harvesting device to one or more electrical components located within the tire 102. FIG. 1C also shows a plane ID from which the cross-section shown in FIG. 1D is taken.

Figure 1D:
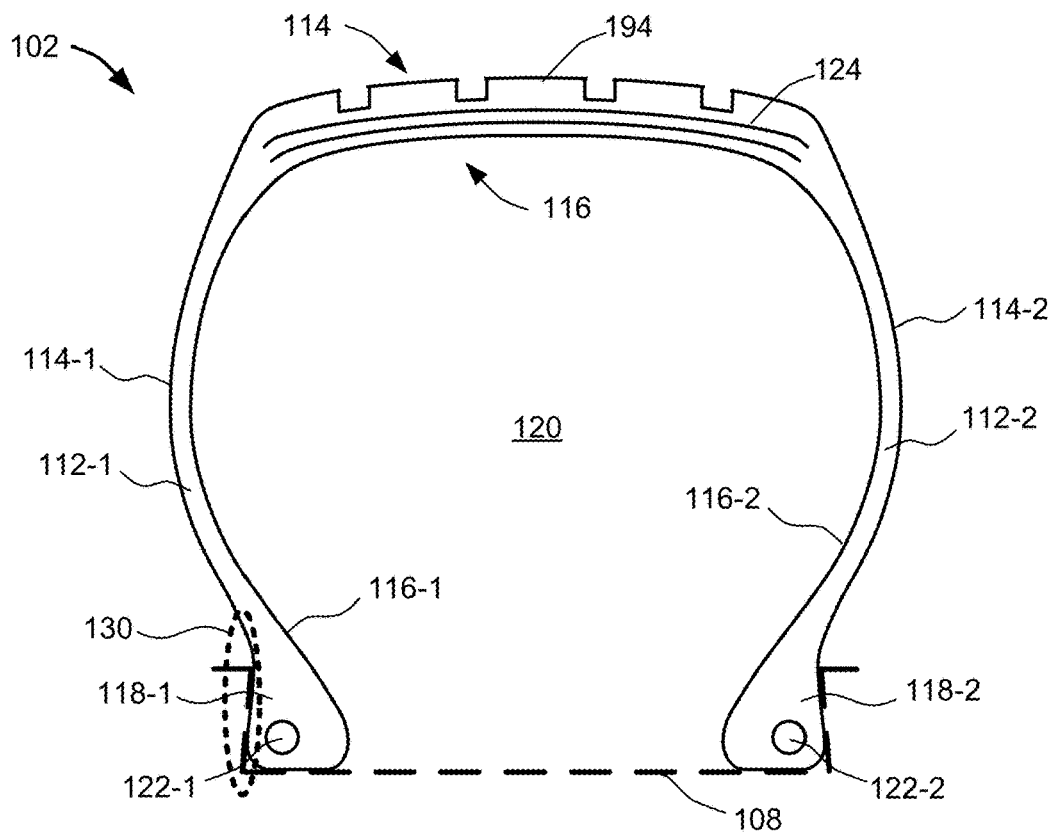
FIG. 1D is a cross-sectional view of the tire shown in FIG. 1C.

FIG. 1D is a cross-sectional view of the tire 102 shown in FIG. 1C. The tire 102 has the tread region 194 extending between two side walls 112-1 and 112-2 (one of which may be called an outer side wall and the other may be called an inner side wall, or vice versa, depending on an orientation of how the tire is mounted on a wheel). The tire 102 has an outer surface 114, including a portion 114-1 of the outer surface 114 on the outer side wall 112-1 and a portion 114-2 of the outer surface 114 on the inner side wall 112-2, and an inner surface 116, including a portion 116-1 of the inner surface 116 on the outer side wall 112-1 and a portion 116-2 of the inner surface 116 on the inner side wall 112-2. The tire 102 also has bead regions 118-1 and 118-2, which contacts a rim 108 of a wheel 104 when the tire 102 is mounted on the wheel 104. In FIG. 1D, the bead regions 118-1 and 118-2 also include bead wires 122-1 and 122-2. In FIG. 1D, the tire also includes one or more belts 124 in the tread region 194.

Although the tire 102 has an open shape (e.g., air may freely enter the space 120 between the side walls 112-1 and 112-2 through an opening toward a center of the tire when the tire is not mounted on a wheel), when the tire 102 is mounted on a wheel, the rim 108 of the wheel seals the opening so that the air within the space 120 is maintained within the space 120. As used herein, this space 120 is called an inside space of the tire 102.

Figure 1E:
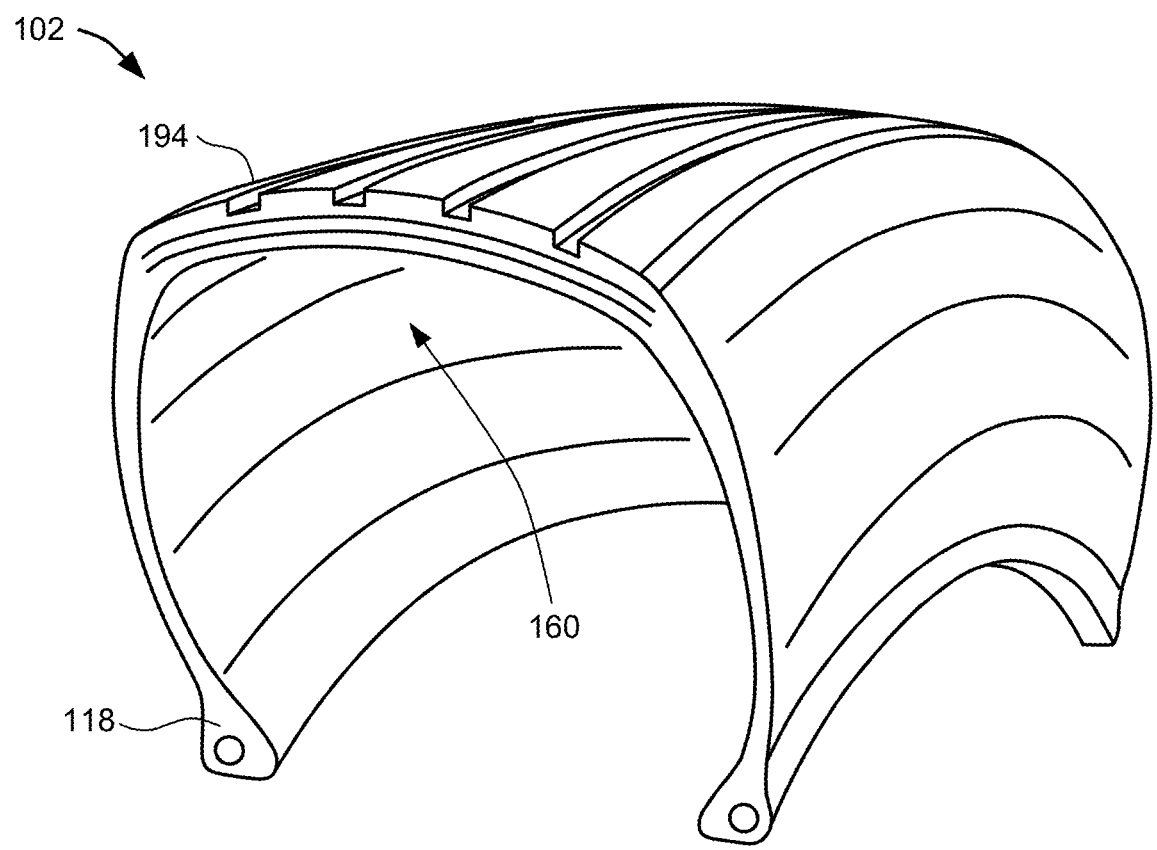
FIG. 1E is a partial cross-sectional view of the tire shown in FIG. 1C.
Figure 1F:
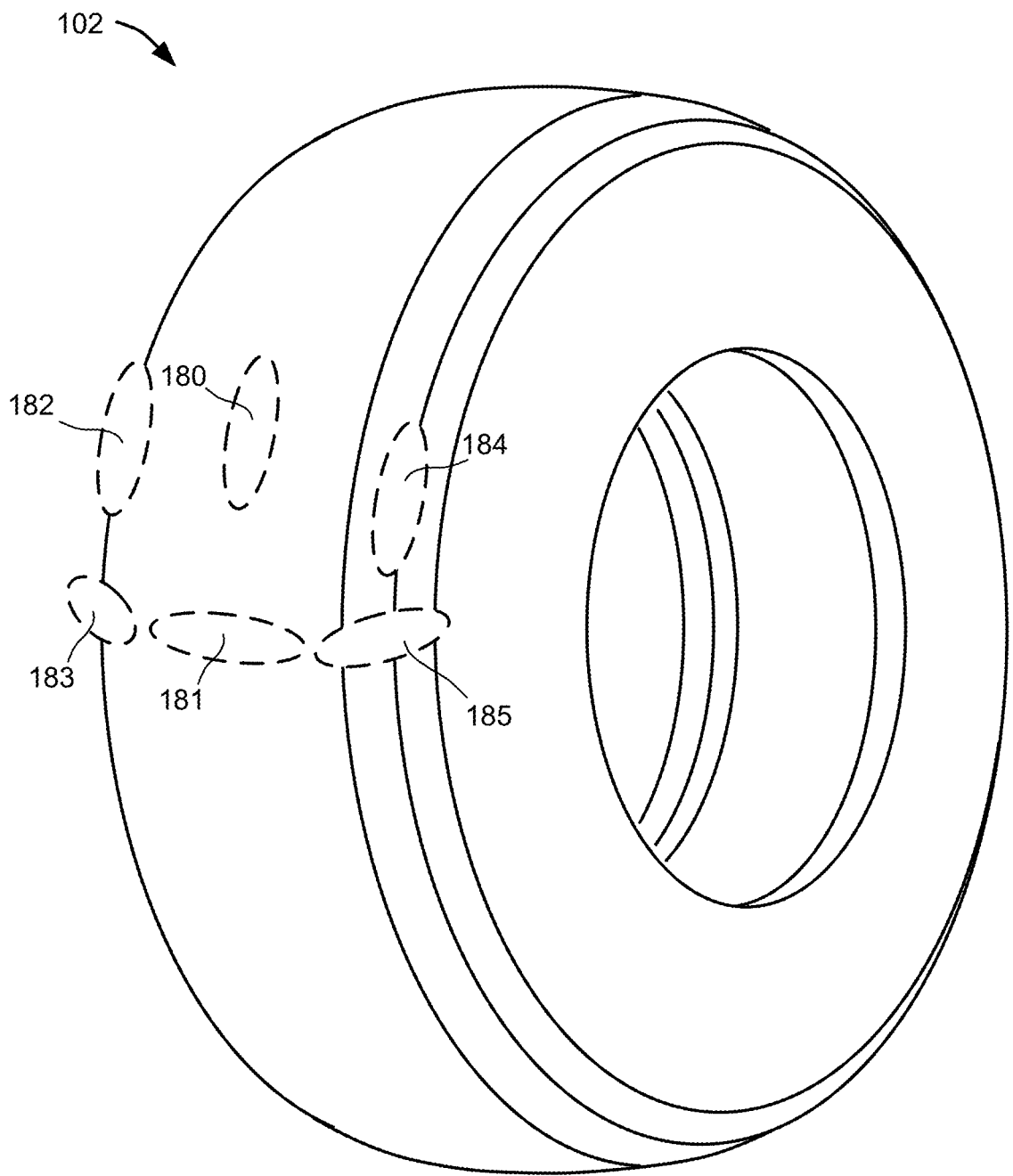
FIG. 1F is a schematic diagram illustrating positions for mounting sensors in accordance with some embodiments.

In some configurations, one or more electrical components are located within the space 120 of the tire 102 (e.g., one or more sensors to measure rotation, acceleration, deceleration, vibration, temperature, pressure, etc.) while one or more energy-harvesting devices are located adjacent to a bead region 118 (e.g., outside the space 120, such as a region 130 between the rim 108 or its rim lip and the bead region 118-1 or 118-2). For example, one or more electrical components may be located on an inner surface 160 of the tire 102 (e.g., the inner surface of the tread region 194 or a side wall) shown in FIG. 1E. In some embodiments, an electrical component (e.g., a sensor) may be placed at a centerline longitudinal location 180 (e.g., at a centerline location with a longitudinal orientation), a centerline lateral location 181 (e.g., a centerline location with a lateral orientation), an inner sidewall longitudinal location 182, an inner sidewall lateral location 183, an outer sidewall longitudinal location 184, or an outer sidewall lateral location 185, as shown in FIG. 1F. In some embodiments, two or more electrical components placed at locations selected from a group consisting of the centerline longitudinal location 180, the centerline lateral location 181, the inner sidewall longitudinal location 182, the inner sidewall lateral location 183, the outer sidewall longitudinal location 184, or the outer sidewall lateral location 185 are used. In some embodiments, at least six electrical components placed at respective locations of the centerline longitudinal location 180, the centerline lateral location 181, the inner sidewall longitudinal location 182, the inner sidewall lateral location 183, the outer sidewall longitudinal location 184, or the outer sidewall lateral location 185 are used.

Figure 1G:
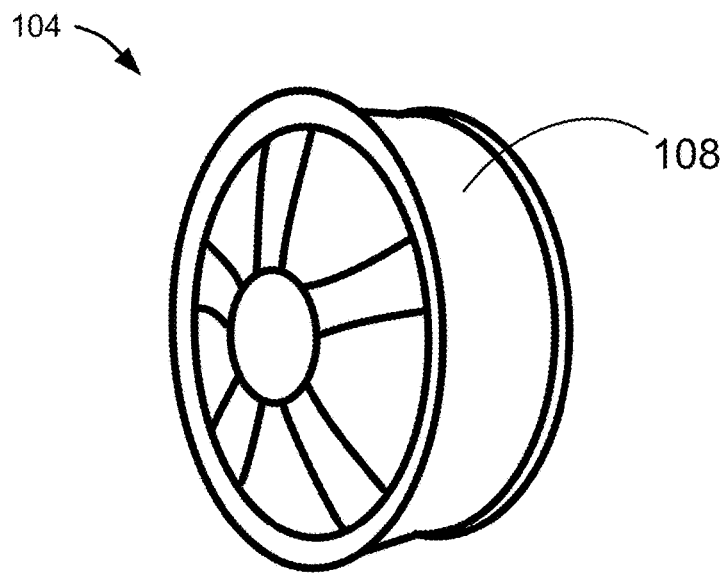
FIG. 1G is a schematic diagram illustrating a wheel in accordance with some embodiments.
Figure 1H:
FIG. 1H is a side view of a wheel showing a rim region of the wheel in accordance with some embodiments.

FIG. 1G is a schematic diagram illustrating a wheel 104 with a rim region 108 (also called a barrel) in accordance with some embodiments. FIG. 1H is a side view of the wheel 104 showing the rim region 108 of the wheel 104 in accordance with some embodiments. In some embodiments, the wheel 104 (e.g., the rim region 108 of the wheel 104) has bead seats 132 and 134. In some embodiments, the rim region 108 also has flanges 142 and 144 (also called rim lips) and retaining humps 152 and 154, which facilitate maintaining a position of a tire mounted on the wheel 104.

Figure 2A:
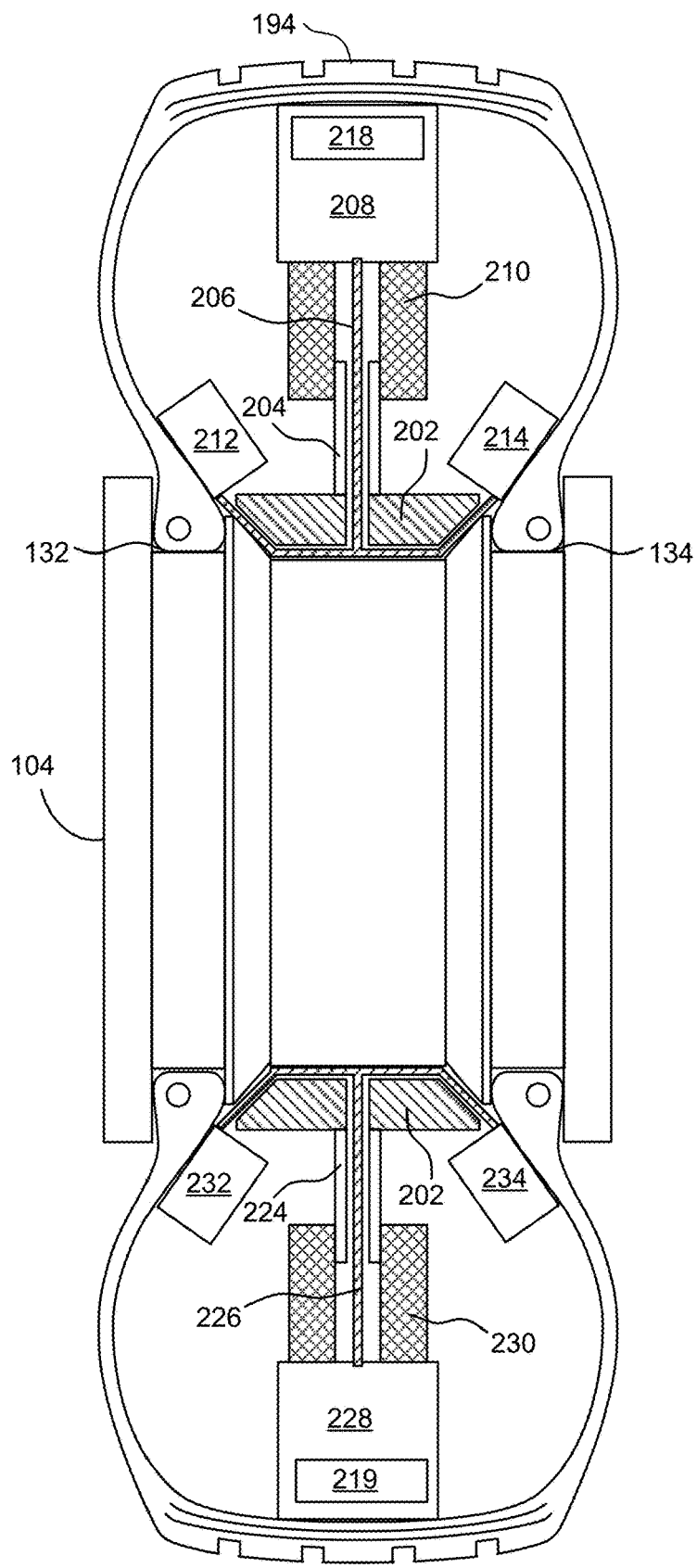
FIG. 2A is a schematic diagram illustrating an electrical connector mounted on a wheel in accordance with some embodiments.

FIG. 2A is a schematic diagram illustrating an electrical connector mounted on a wheel in accordance with some embodiments. The electrical connector includes a sleeve 202 configured for mounting on a wheel 104 (e.g., on or around a rim region of the wheel 104). The electrical connector also includes one or more hollow spokes (e.g., spokes 204 and 224) coupled to the sleeve 202, and one or more electrical conductors (e.g., electrical conductors 206 and 226, such as electrical wires). In some embodiments, a respective electrical conductor is covered with an insulating material (e.g., an insulating cover or jacket). A respective electrical conductor extends from a portion of the sleeve 202 adjacent to a bead seat region (e.g., 132 or 134) of the wheel 104 or the bead region of the mounted tire. This allows the electrical conductor to couple with one or more energy harvesters (e.g., electrical conductor 206 is coupled with energy harvesters 212 and 214 and electrical conductor 226 is coupled with energy harvesters 232 and 234). The respective electrical conductor extends through one or more channels defined in the sleeve 202 and a respective spoke for electrical coupling with an electrical module (e.g., the electrical conductor 206 extends through the spoke 204 toward the electrical module 208 that includes a sensor 218 and the electrical conductor 226 extends through the spoke 224 toward the electrical module 228 that includes a sensor 219).

In some embodiments, the electrical connector includes a single hollow spoke (e.g., 204 only). In some embodiments, the electrical connector includes two or more hollow spokes (e.g., 204 and 224).

In some embodiments, the electrical connector includes one or more guides (e.g., 210 and/or 230) positioned for coupling with one or more spokes. In some embodiments, the guide defines a through-hole for allowing an electrical conductor to extend through the through-hole toward the electrical module.

Figure 2B:
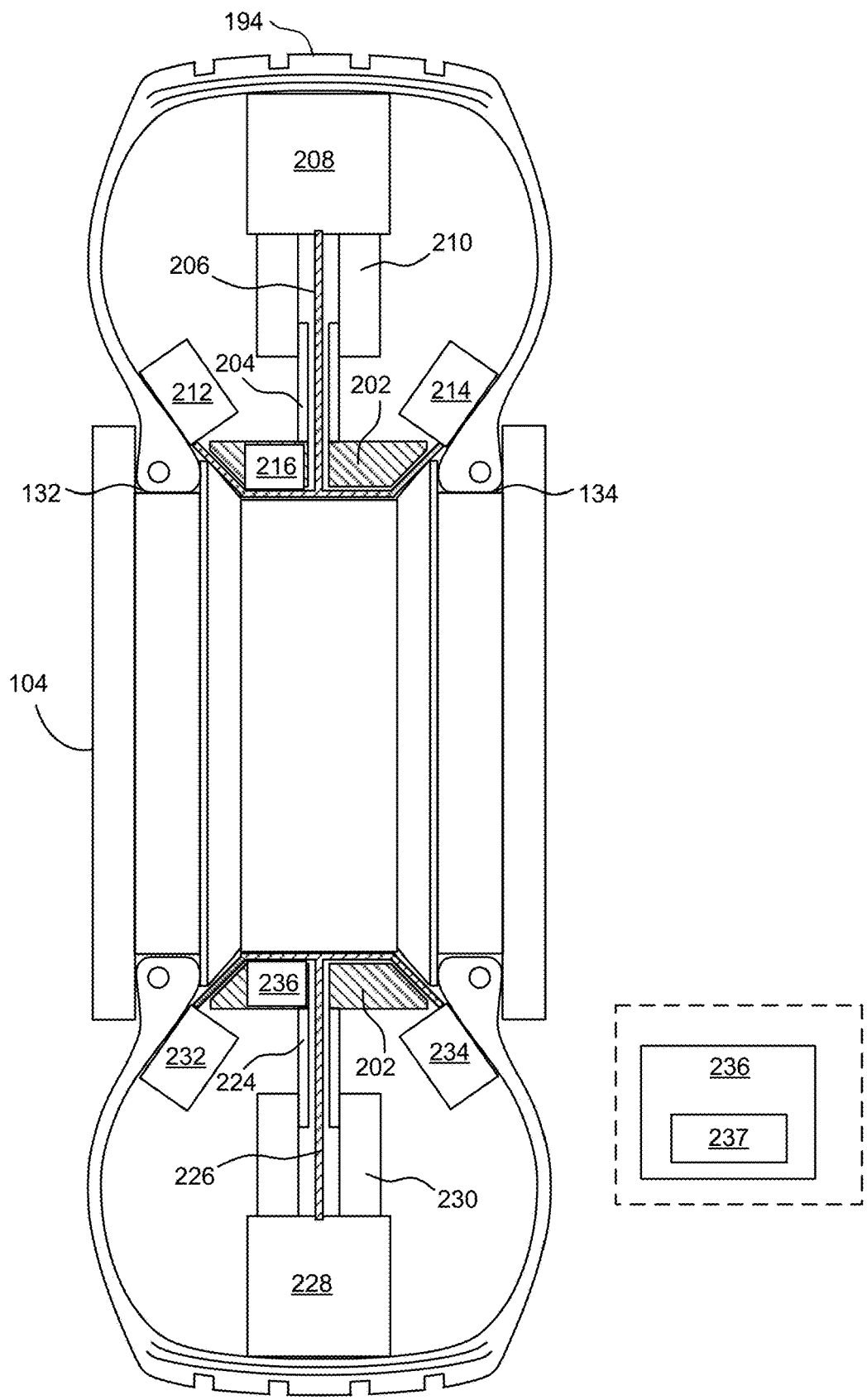
FIG. 2B is a schematic diagram illustrating an electrical connector mounted on a wheel in accordance with some embodiments.

FIG. 2B is a schematic diagram illustrating an electrical connector mounted on a wheel in accordance with some embodiments. The electrical connector shown in FIG. 2B is similar to the electrical connector shown in FIG. 2A, except that the electrical connector shown in FIG. 2B is configured to couple one or more electrical conductors to a control module (e.g., 216 or 236). For example, the one or more electrical conductors may provide electrical power to the control module, or transmit electrical signals from the electrical module (e.g., one or more sensors) to the control module. In some embodiments, as shown in the inset of FIG. 2B, the control module includes one or more processors 237 for processing signals from the electrical module. In some embodiments, the control module includes communication circuit (e.g., wireless communication circuit) for transmitting signals (e.g., to one or more electrical components on a vehicle that are located away from the wheel, such as an electronic control unit of the vehicle). In some embodiments, the electrical connector includes one or more control modules (e.g., the one or more control modules are part of the electrical connector).

Figure 2C:
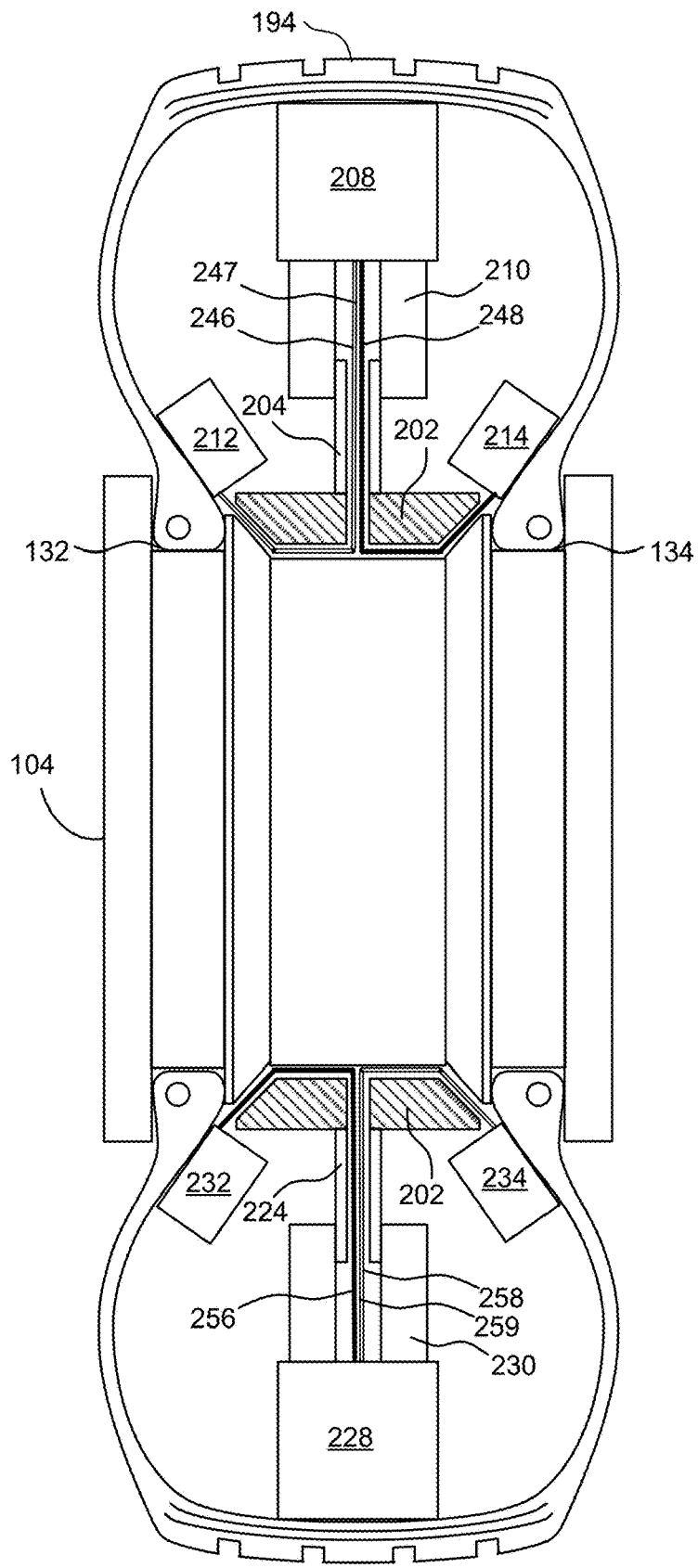
FIG. 2C is a schematic diagram illustrating an electrical connector mounted on a wheel in accordance with some embodiments.

FIG. 2C is a schematic diagram illustrating an electrical connector mounted on a wheel in accordance with some embodiments. The electrical connector shown in FIG. 2C is similar to the electrical connector shown in FIG. 2A, except that the electrical connector shown in FIG. 2C includes two electrical conductors 246 and 248 so that the electrical conductor 246 extends from the electrical module 208 to the energy harvester 212 and the electrical conductor 248 extends from the electrical module 208 to the energy harvester 214 whereas in the electrical connector shown in FIG. 2B, the electrical conductor 206 extends from the electrical module 208 to both the energy harvesters 212 and 214. In some embodiments, the electrical connector shown in FIG. 2C also includes two electrical conductors 256 and 258 so that the electrical conductor 256 extends from the electrical module 228 to the energy harvester 232 and the electrical conductor 258 extends from the electrical module 228 to the energy harvester 234.

The electrical connectors shown in FIGS. 2A-2C may include one or more features shown in another figure. For example, the electrical connector shown in FIG. 2C may include one or more features shown in FIG. 2B. In another example, the electrical connector shown in FIG. 2B may include one or more features shown in FIG. 2C. For brevity, such details are not repeated herein.

Figure 2D:
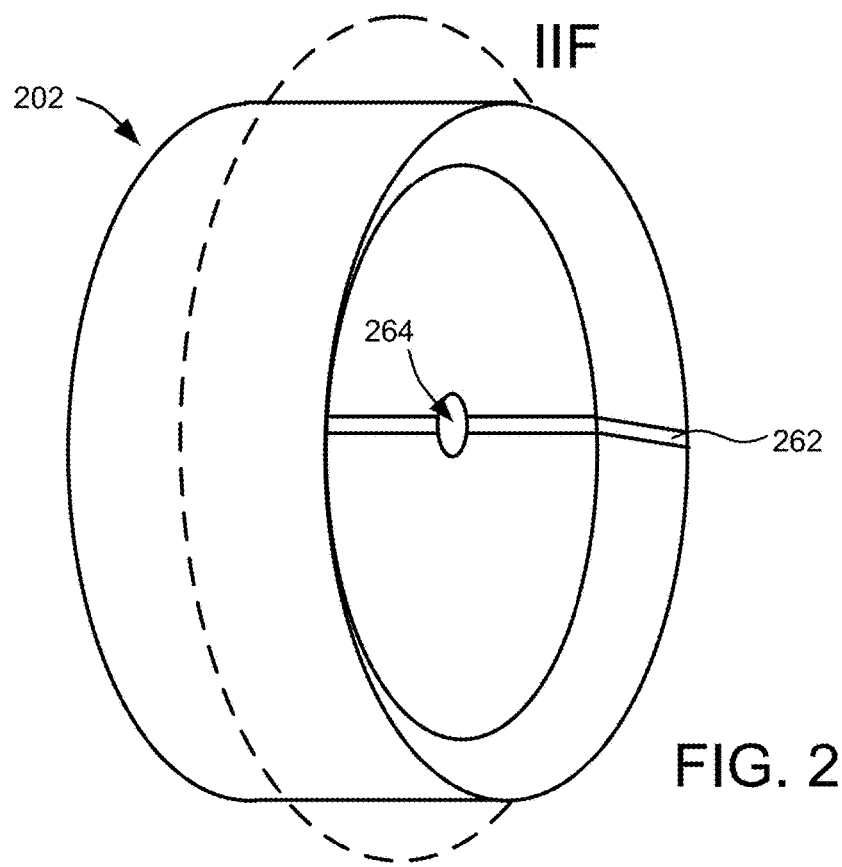
FIG. 2D is a schematic diagram illustrating a sleeve in accordance with some embodiments.

FIG. 2D is a schematic diagram illustrating the sleeve 202 in accordance with some embodiments. In some embodiments, the sleeve 202 generally has a tubular shape. This allows the sleeve 202 to wrap around a rim region of a wheel. In some embodiments, the sleeve 202 has a shape of a complete tube (e.g., the thickness and width of the sleeve is substantially uniform along its circumference). In some embodiments, the sleeve 202 has a shape of a tube with one or more portions removed (e.g., the width and/or the thickness of the sleeve varies along the circumference of the sleeve).

In some embodiments, one or more through-holes (e.g., 264) are defined in the sleeve for allowing an electrical conductor to pass through one of the one or more through-holes (e.g., and through a spoke coupled adjacent to the through-hole). In some embodiments, a center of the through-hole is aligned with a center of the spoke.

In some embodiments, one or more channels 262 (e.g., one or more indentations) are defined in the sleeve 202. In some embodiments, a respective channel extends continuously from a portion of the sleeve 202 corresponding to a bead seat region of a wheel to the through-hole so that an electrical conductor may extend from an electrical component positioned adjacent to the bead seat region (e.g., an energy harvester) to at least the through-hole (and subsequently through the spoke positioned adjacent to the through-hole).

Figure 2E:
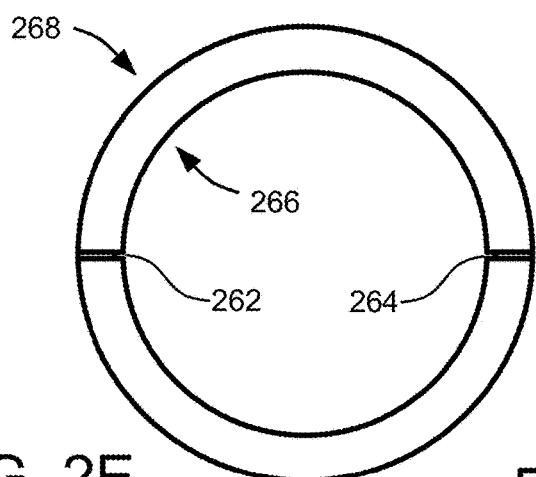
FIG. 2E is a side view of the sleeve shown in FIG. 2D.

FIG. 2E is a side view of the sleeve 202 shown in FIG. 2D. In some embodiments, the sleeve has a surface 266 (e.g. an inner surface) and a surface 268 (e.g., an outer surface) that is opposite to the surface 266. The surface 266 faces the barrel of a wheel and the surface 268 faces away from the barrel when the sleeve 202 is coupled to (e.g., mounted on) the barrel of the wheel. FIG. 2E shows two channels 262 and 264 defined on the surface 266 of the sleeve 202.

Figure 2F:
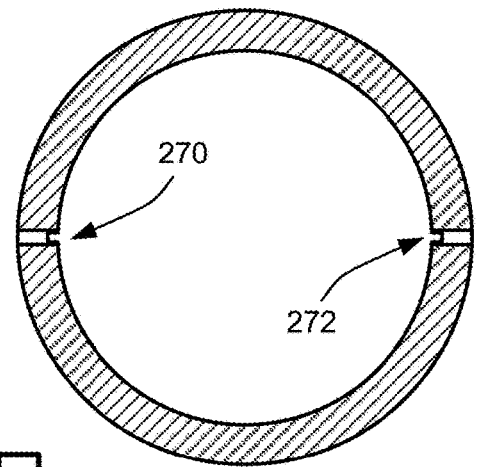
FIG. 2F is a cross-sectional view of the sleeve shown in FIG. 2D.

FIG. 2F is a cross-sectional view of the sleeve 202 shown in FIG. 2D along the plane IIF shown in FIG. 2D. In FIG. 2F, two through-holes 270 and 272 are defined in the sleeve 202 so that electrical conductors may extend from the inner surface of the sleeve 202 to the outer surface of the sleeve 202.

Figure 2G:
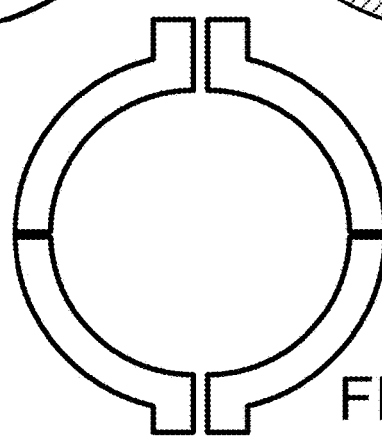
FIG. 2G is a side view of a sleeve in accordance with some embodiments.

Although FIGS. 2D-2F show the sleeve as a single object, in some embodiments, the sleeve is made of two or more parts that are joined together to form the sleeve. For example, FIG. 2G shows a sleeve that includes two parts that may be joined together with a flange.

Figure 2H:
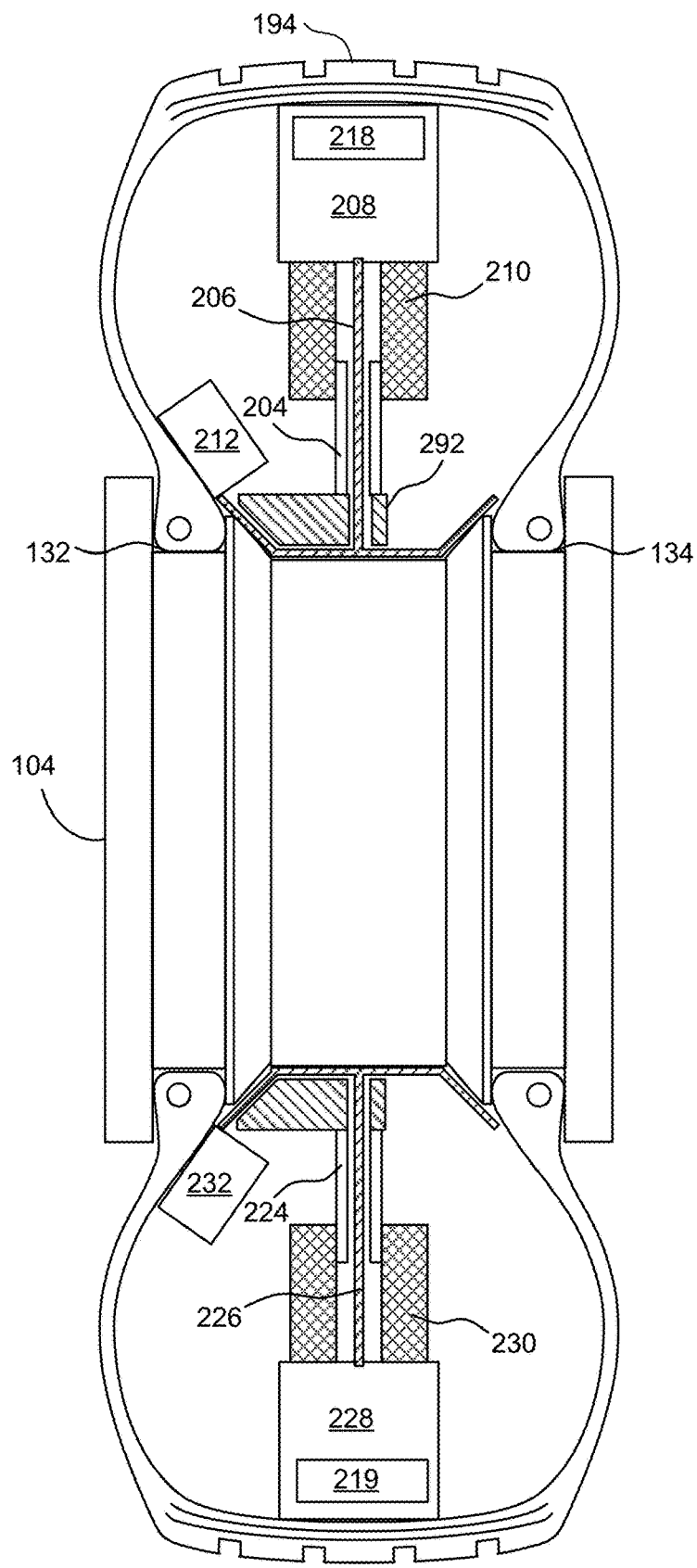
FIG. 2H is a schematic diagram illustrating an electrical connector mounted on a wheel in accordance with some embodiments.

FIG. 2H is a schematic diagram illustrating an electrical connector mounted on a wheel in accordance with some embodiments. The electrical connector shown in FIG. 2H is similar to the electrical connector shown in FIG. 2A, except that the sleeve 292 shown in FIG. 2H does not extend adjacently to both bead seat regions 132 and 134 of the wheel (e.g., the sleeve 292 extends adjacently to the bead seat region 132 but not to the bead seat region 134) while the sleeve 202 shown in FIG. 2A extends adjacently to both bead seat regions 132 and 134.

Figure 3A:
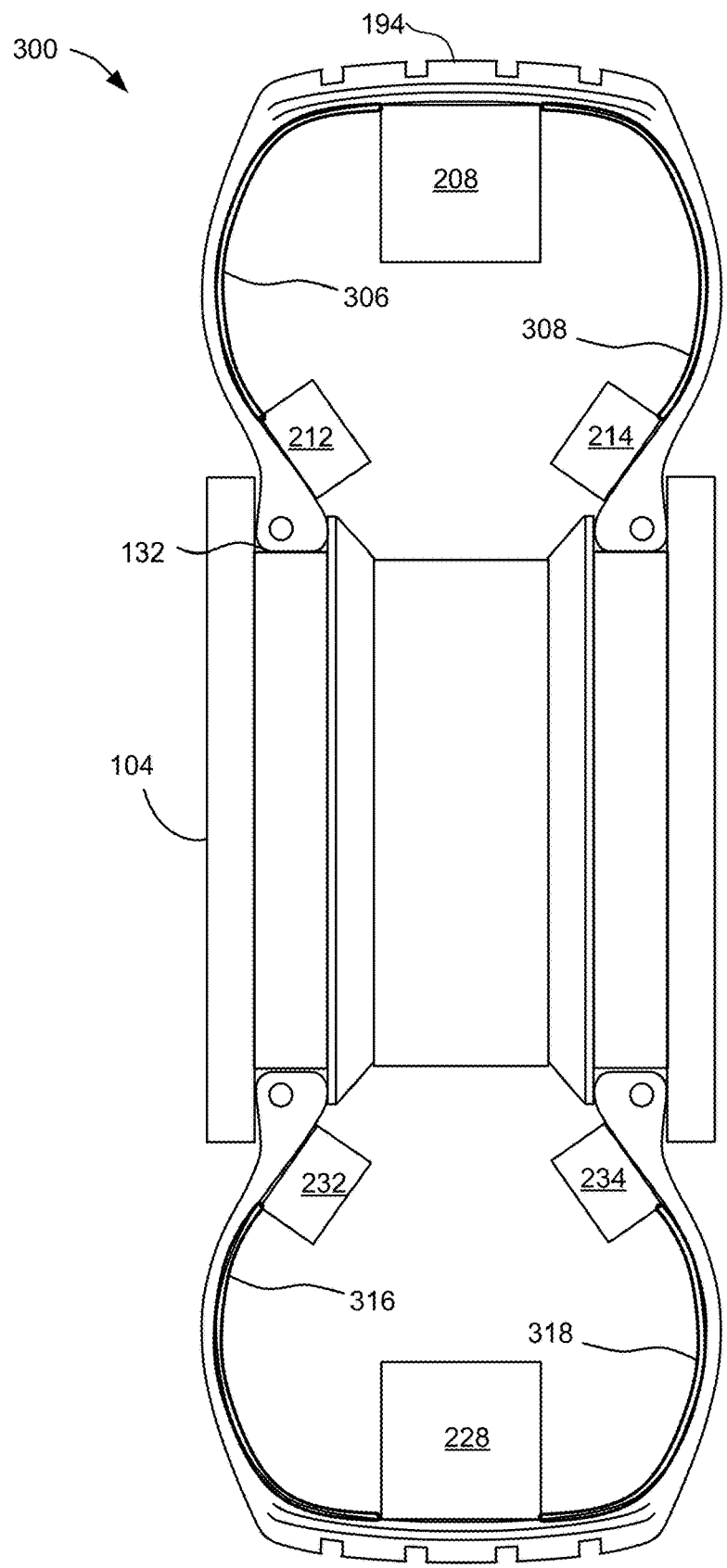
FIG. 3A is a schematic diagram illustrating an electrical connector mounted on a wheel in accordance with some embodiments.

FIG. 3A is a schematic diagram illustrating an electrical connector mounted on a wheel in accordance with some embodiments. In the electrical connector shown in FIG. 3A, electrical modules may be coupled to one or more energy harvesters via one or more electrical conductors positioned on an inside surface of the tire. For example, the electrical module 208 is electrically coupled to the energy harvester 212 by an electrical conductor 306 extending along the inside surface of the tire. In some configurations, the electrical module 208 is electrically coupled also to the energy harvester 214 by an electrical conductor 308 extending along the inside surface of the tire. Similarly, in some configurations, the electrical module 228 is electrically coupled to the energy harvester 232 by an electrical conductor 316 extending along the inside surface of the tire. In some configurations, the electrical module 228 is electrically coupled also to the energy harvester 234 by an electrical conductor 316 extending along the inside surface of the tire.

Figure 3B:
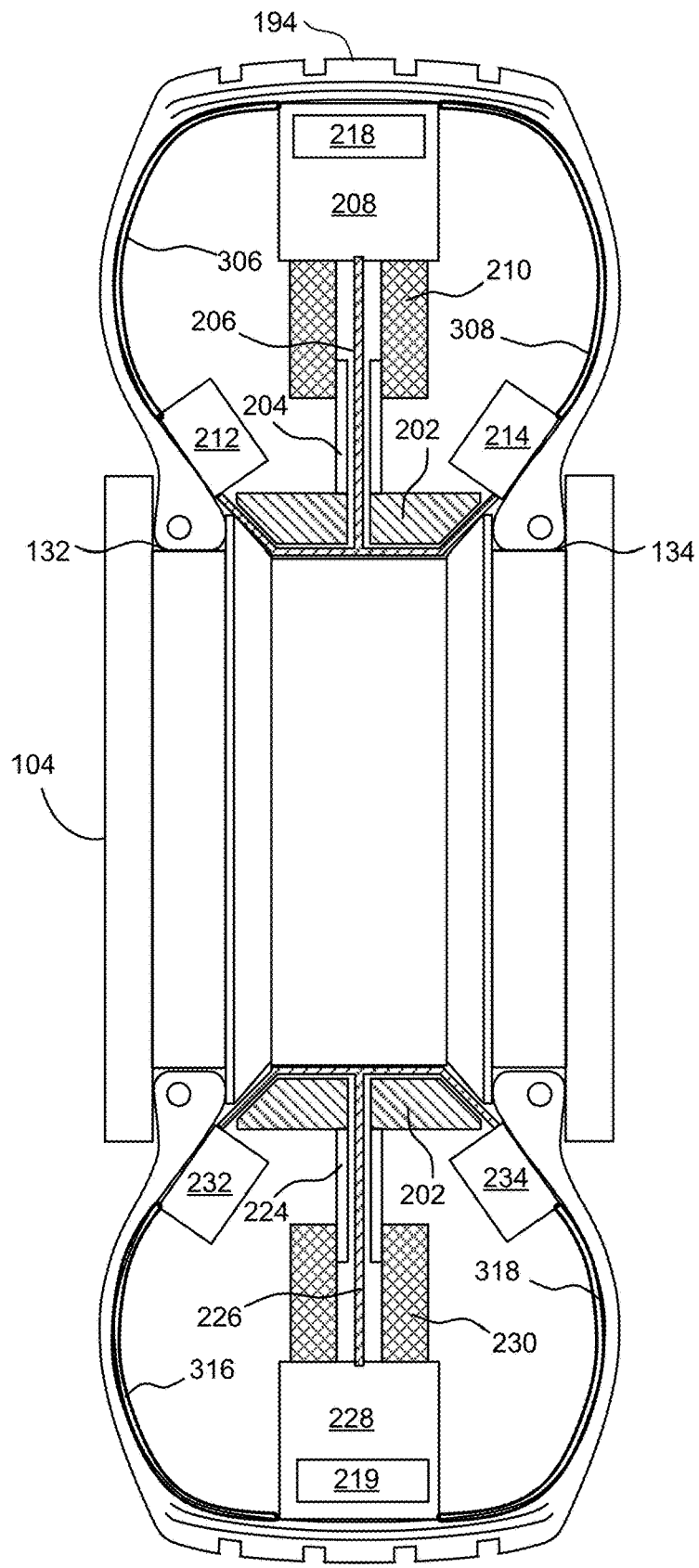
FIG. 3B is a schematic diagram illustrating an electrical connector mounted on a wheel in accordance with some embodiments.

FIG. 3A is a schematic diagram illustrating an electrical connector mounted on a wheel in accordance with some embodiments. The electrical connector shown in FIG. 3B is similar to the electrical connector shown in FIG. 3A except that the electrical connector shown in FIG. 3B also includes the sleeve 202 and one or more spokes (e.g., 204 and 224) shown in FIGS. 2A-2C.

Although FIGS. 2A-2C and FIGS. 3A-3B show electrical modules located along a centerline of the tread region 194 of the tire, in some embodiments, the electrical modules may be placed at other locations within the tire in various orientations. For example, as described with respect to FIG. 1F, an electrical module (or a sensor included in the electrical module) may be placed at any one of the locations 180 through 185. In some embodiments, the electrical connector is coupled to two or more electrical modules (or two or more sensors) located at respective locations selected from the locations 180 through 185 (e.g., at locations 182 and 184, locations 180 and 183, etc.). In some embodiments, the electrical connector is coupled to at least six electrical modules (or at least six sensors) located at respective locations of the locations 180 through 185 (e.g., a first sensor located at the location 180, a second sensor located at the location 181, a third sensor located at the location 182, a fourth sensor located at the location 183, a fifth sensor located at the location 184, and a sixth sensor located at the location 185).

In addition, although FIGS. 2A-2C and FIGS. 3A-3B show energy harvesters 212, 214, 232, and 234 located on an inner surface of the tire, in some embodiments, one or more energy harvesters are located on an outer surface of the tire. For example, one or more energy harvesters may be located in a region between the rim (or its rim lip) and the adjacent bead region, such as the region 130 as shown in FIG. 1D.

Figure 4:
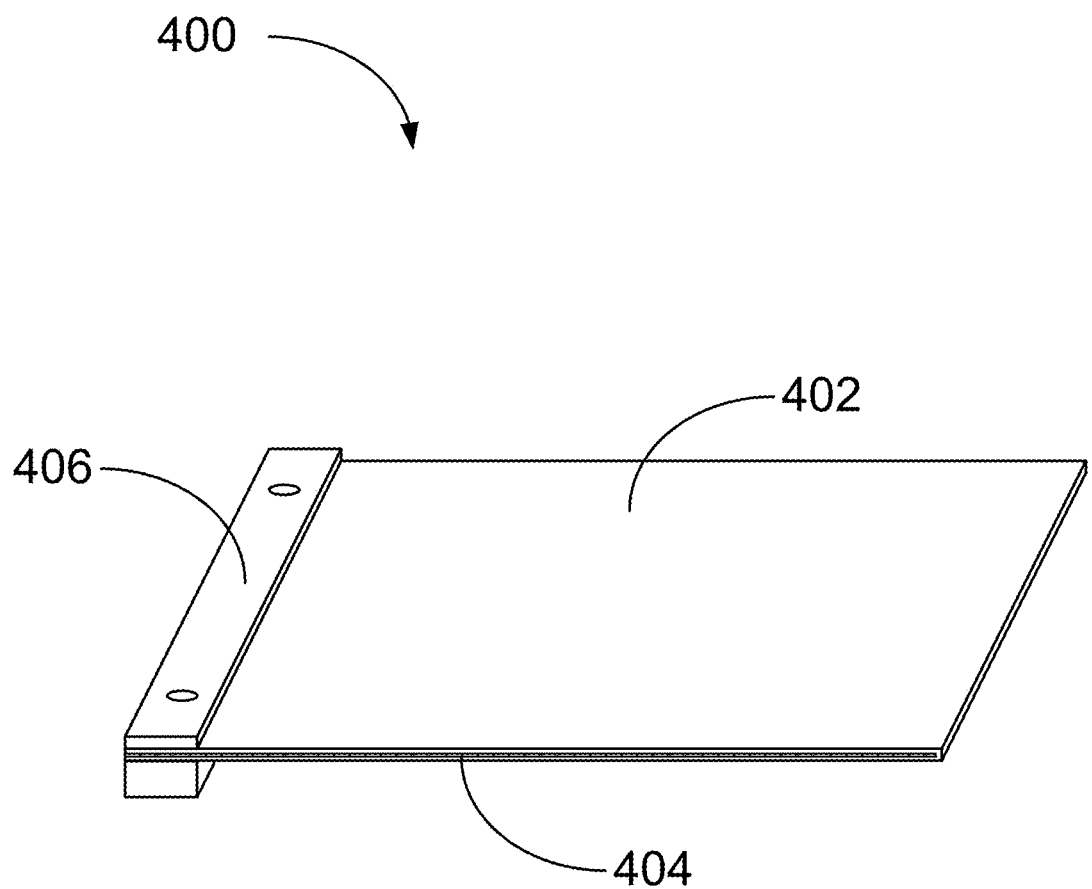
FIG. 4 is a schematic diagram illustrating an energy harvester in accordance with some embodiments.

FIG. 4 is a schematic diagram illustrating the energy harvester 400 (also called an energy generator) in accordance with some embodiments. In some embodiments, one or more of the energy harvesters described herein (e.g., energy harvesters 212, 214, 232, 234 described with respect to FIGS. 2A-2C and 3A-3B) have a structure corresponding to, or analogous to, the structure of the energy harvester 400.

In FIG. 4, the energy harvester 400 includes a cantilever 402. In some embodiments, the cantilever 402 is a projecting beam supported by one end. In some embodiments, the cantilever 402 has a uniform width and a uniform thickness along its length, as shown in FIG. 4. In some embodiments, the cantilever 402 has (1) a non-uniform width along its length while its thickness remains uniform along its length, (2) a non-uniform thickness along its length while its width remains uniform along its length, or (3) a non-uniform width and a non-uniform thickness along its length.

In some embodiments, the cantilever 402 includes a piezoelectric material 404. Examples of piezoelectric materials include gallium nitride, indium nitride, aluminum nitride, zinc oxide, barium titanate, lead zirconate titanate, potassium niobate, sodium tungstate, $Ba_2NaNb_5O_5$, $Pb_2KNb_5O_5$, single crystalline zinc oxide, langasite, gallium orthophosphate, lithium niobate, lithium tantalite, sodium potassium niobate, bismuth ferrite, sodium niobate, bismuth titanate, sodium bismuth titanate, quartz, berlinite, topaz, lead titanate, and piezoelectric polymers, such as polyvinylidene fluoride, polyamides, paralyne-C, polyimide, and polyvinylidene chloride. Piezoelectric materials are capable of generating electrical charge in response to applied mechanical stress. Thus, when the cantilever 402 bends, the piezoelectric material provides charges that are indicative of the amplitude of how much the cantilever 402 is bent (e.g., a displacement of a free end of the cantilever 402). Similarly, when the cantilever 402 vibrates, the piezoelectric material in the cantilever 402 provides an (oscillating) electrical signal that corresponds to the vibration of the cantilever 402.

The length, width, and thickness of the cantilever 402 are selected to obtain a desired performance of the energy harvester 400. In some embodiments, the length is between 1 cm and 30 cm, between 1 cm and 10 cm, between 5 cm and 15 cm, between 10 cm and 20 cm, between 15 cm and 25 cm, between 20 cm and 0 cm, between 1 cm and 5 cm, between 5 cm and 10 cm, between 10 cm and 15 cm, between 15 cm and 20 cm, between 20 cm and 25 cm, between 25 cm and 0 cm, between 1 cm and 3 cm, between 2 cm and 4 cm, between 3 cm and 5 cm, between 4 cm and 6 cm, between 5 cm and 7 cm, between 6 cm and 8 cm, between 7 cm and 9 cm, or between 8 cm and 10 cm. In some embodiments, the length is approximately 1 cm, approximately 2 cm, approximately 3 cm, approximately 4 cm, approximately 5 cm, approximately 6 cm, approximately 7 cm, approximately 8 cm, approximately 9 cm, approximately 10 cm, approximately 15 cm, approximately 20 cm, approximately 25 cm, or approximately 0 cm. In some embodiments, the width is between 1 cm and 10 cm, between 5 cm and 15 cm, between 10 cm and 20 cm, between 1 cm and 5 cm, between 5 cm and 10 cm, between 10 cm and 15 cm, between 15 cm and 20 cm, between 1 cm and 4 cm, between 2 cm and 5 cm, between 3 cm and 6 cm, between 4 cm and 7 cm, between 5 cm and 8 cm, between 6 cm and 9 cm, or between 7 cm and 10 cm. In some embodiments, the width is approximately 1 cm, approximately 2 cm, approximately 3 cm, approximately 4 cm, approximately 5 cm, approximately 6 cm, approximately 7 cm, approximately 8 cm, approximately 9 cm, approximately 10 cm, approximately 15 cm, or approximately 20 cm. In some embodiments, the thickness of the cantilever 402 is between 100 μm and 5 mm, between 100 μm and 3 mm, between 1 mm and 4 mm, between 2 mm and 5 mm, between 100 μm and 1 mm, between 500 μm and 1.5 mm, between 1 mm and 2 mm, between 1.5 mm and 2.5 mm, between 2 mm and 3 mm, between 2.5 mm and 3.5 mm, between 3 mm and 4 mm, between 3.5 mm and 4.5 mm, between 4 mm and 5 mm, between 100 μm and 500 μm, between 500 μm and 1 mm, between 1 mm and 1.5 mm, between 1.5 mm and 2 mm, between 2 mm and 2.5 mm, or between 2.5 mm and 3 mm. In some embodiments, the thickness of the cantilever 402 is approximately 100 μm, approximately 200 μm, approximately 300 μm, approximately 400 μm, approximately 500 μm, approximately 600 μm, approximately 1 mm, approximately 2 mm, approximately 3 mm, approximately 4 mm, or approximately 5 mm. In some embodiments, the thickness of a layer of the piezoelectric material in the cantilever 402 is between 10 μm and 1 mm, between 100 μm and 500 μm, between 200 μm and 600 μm, between 300 μm and 700 μm, between 400 μm and 800 μm, between 500 μm and 900 μm, between 600 μm and 1 mm, between 50 μm and 150 μm, between 100 μm and 200 μm, between 150 μm and 250 μm, between 200 μm and 300 μm, between 250 μm and 350 μm mm, between 300 μm and 400 μm, between 350 μm and 450 μm, between 400 μm and 500 μm, between 500 μm and 600 μm, between 600 μm and 700 μm, between 700 μm and 800 μm, or between 800 μm and 900 μm. In some embodiments, the thickness of the layer of the piezoelectric material in the cantilever 202 is approximately 100 μm, approximately 200 μm, approximately 300 μm, approximately 400 μm, approximately 500 μm, approximately 600 μm, approximately 700 μm, approximately 800 μm, approximately 900 μm, approximately 1 mm, approximately 2 mm, approximately 3 mm, approximately 4 mm, or approximately 5 mm.

In some embodiments, the cantilever 402 includes a single layer of piezoelectric material. In some embodiments, the cantilever 402 includes two or more layers of piezoelectric material. In some embodiments, the two or more layers of piezoelectric material are separated by one or more interleaving layers of an insulating material or a conductive material.

FIG. 4 also shows a clamp 406 that is configured to support and immobilize one end of the cantilever 402. In FIG. 4, the clamp 406 has a shape of a plate. However, a clamp having any other shape may be used. Although FIG. 4 shows that the clamp 406 is located at the tip of the cantilever 402, the clamp 406 does not need to be aligned with a tip of the cantilever 402. For example, the clamp 406 may be positioned offset from the tip of the cantilever 402 (e.g., by 1 mm, 2 mm, 3 mm, 4 mm, 5 mm, 7 mm, 10 mm, 15 mm, 20 mm, 25 mm, etc.) so that there is an overhang when the clamp 406 is positioned on the cantilever 402. In some embodiments, the cantilever 402 extends in a single direction from the clamp 406. In some embodiments, the cantilever 402 extends in multiple directions (e.g., in two opposite directions) from the clamp 406.

In some embodiments, the clamp 406 and/or the cantilever 402 have one or more through-holes for securing the cantilever 402 and the clamp to a base. For example, screws may be placed through corresponding through-holes for immobilizing the clamp 406 and the cantilever 402. Alternatively, other mechanisms may be used for immobilizing the cantilever 402. For example, the clamp 406 and the cantilever 402 may have slits through which a clip is inserted to immobilize the clamp 406 and the cantilever 402. In another example, the cantilever 402 may be integrated with its base, in which case the clamp 406 is omitted.

In light of these examples and principles explained herein, we now turn to certain embodiments.

In accordance with some embodiments, an electrical connector includes a sleeve (e.g., sleeve 202) sized for mounting on a barrel of a wheel (e.g., FIG. 2A). The sleeve defines one or more channels (e.g., channels 262 and 264). In some embodiments, a first side of the sleeve extends at least to a first bead seat region of the wheel (e.g., the sleeve 202 extends to the bead seat region 132 in FIG. 2A). The electrical connector also includes one or more hollow spokes (e.g., spoke 204) mechanically coupled with the sleeve. The electrical connector further includes one or more electrical conductors (e.g., electrical conductor 206). At least a first electrical conductor of the one or more electrical conductors extends from a first portion of the sleeve corresponding to the first bead seat region through the one or more channels and a first hollow spoke of the one or more hollow spokes for electrically coupling with a first electrical module positioned on a first tread region of a tire mounted on the wheel (e.g., electrical conductor 206 extends from the bead region of the tire through the channel between the sleeve 202 and the wheel and through the spoke 204 toward the electrical module 208 mounted on the tread region 194 of the tire).

In some embodiments, a second side of the sleeve, opposite to the first side of the sleeve, extends at least to a second bead seat region of the wheel that is opposite to the first bead seat region of the wheel (e.g., the sleeve 202 also extends to the bead seat region 134 shown in FIG. 2C), and the one or more electrical conductors include a second electrical conductor (e.g., electrical conductor 248) extending from a second portion of the sleeve corresponding to the second bead seat region.

In some embodiments, the second electrical conductor extends through the one or more channels and the first hollow spoke of the one or more hollow spokes for electrically coupling with the first electrical module positioned on the first tread region of the tire mounted on the wheel (e.g., FIG. 2C).

In some embodiments, the second electrical conductor extends through the one or more channels and a second hollow spoke of the one or more hollow spokes for electrically coupling with a second electrical module positioned on a second tread region of the tire mounted on the wheel (e.g., electrical conductor 258 extends from the second bead seat region 134 through a second spoke 224 to a second electrical module 228).

In some embodiments, the one or more electrical conductors include at least a third electrical conductor (e.g., electrical conductor 259), distinct from the second electrical conductor, extending from the second portion of the sleeve corresponding to the second bead seat region through the one or more channels and the second hollow spoke of the one or more hollow spokes.

In some embodiments, the one or more electrical conductors include at least a fourth electrical conductor (e.g., electrical conductor 247), distinct from the first electrical conductor, extending from the first portion of the sleeve corresponding to the first bead seat region through the one or more channels and the first hollow spoke of the one or more hollow spokes.

In some embodiments, the sleeve has a first surface (e.g., surface 266) facing the barrel and a second surface (e.g., 268) facing away from the barrel; and at least one channel is defined on the first surface of the sleeve (e.g., in FIG. 2E, channels 262 and 264 are defined at least on the surface 266).

In some embodiments, the electrical connector includes a first guide (e.g., guide 210) positioned for coupling with the first hollow spoke (e.g., spoke 204) and the first electrical module (e.g., electrical module 208) and for allowing the first electrical conductor (e.g., electrical conductor 206) to extend through the first guide (e.g., electrical module 208) to the first electrical module (e.g., electrical module 208).

In some embodiments, the first guide (e.g., guide 210) is slidably coupled with the first hollow spoke (e.g., spoke 204). For example, the outer diameter of the spoke 204 is smaller than the inner diameter of the through-hole defined in the guide 210 so that the spoke 204 may slide within the through-hole defined in the guide 210.

In some embodiments, the one or more electrical conductors include an electrical conductor (e.g., the electrical conductor 306 shown in FIG. 3B) extending from a portion of the sleeve corresponding to a bead seat region of the wheel to the first electrical module along an inner surface of a tire mounted on the wheel.

In accordance with some embodiments, an electrical device includes any electrical connector described herein and one or more energy harvesters, including a first energy harvester electrically coupled with the first electrical conductor. For example, the electrical device includes (i) the electrical connector with the sleeve 202, the spoke 204, and the electrical conductor 206, and (ii) the energy harvester 212, as shown in FIG. 2A. However, in some embodiments, an electrical module shown in FIG. 2A is not part of the electrical device (although the electrical device may couple to the electrical module). In some embodiments, the electrical device includes the electrical module.

In some embodiments, the first energy harvester is mounted adjacently to the first bead seat region of the wheel (e.g., in FIG. 2A, the energy harvester 212 is positioned adjacently to the bead seat region 132).

In some embodiments, the one or more energy harvesters include a second energy harvester mounted adjacently to a second bead seat region of the wheel that is opposite to the first bead seat region of the wheel (e.g., in FIG. 2A, the energy harvester 214 is positioned adjacently to the bead seat region 134).

In some embodiments, the electrical device includes the first electrical module (e.g., electrical module 208) electrically coupled with the first electrical conductor.

In accordance with some embodiments, an electrical device includes any electrical connector described herein and the first electrical module electrically coupled with the first conductor. For example, the electrical device includes (i) the electrical connector with the sleeve 202, the spoke 204, and the electrical conductor 206, and (ii) the electrical module 208, as shown in FIG. 2A. However, in some embodiments, an energy harvester (e.g., the energy harvester 212) shown in FIG. 2A is not part of the electrical device (although the electrical device may couple to the energy harvester). In some embodiments, the electrical device includes the energy harvester.

In some embodiments, the first electrical module includes one or more sensors (e.g., sensor 218).

In some embodiments, the electrical device includes a control module (e.g., the control module 216 shown in FIG. 2B) mounted on the sleeve. The control module includes one or more processors (e.g., processor 237 shown in the inset of FIG. 2B) electrically coupled with at least one electrical conductor of the one or more electrical conductors. In some embodiments, the control module controls operations of the electrical module, and/or processes and transmits electrical signals from the electrical module.

In accordance with some embodiments, an electrical device includes any electrical connector described herein and a control module mounted on the sleeve. The control module includes one or more processors (e.g., processor 237 shown in the inset of FIG. 2B) electrically coupled with at least one electrical conductor of the one or more electrical conductors. For example, the electrical device includes (i) the electrical connector with the sleeve 202, the spoke 204, and the electrical conductor 206, and (ii) the control module 216, as shown in FIG. 2B. However, in some embodiments, an electrical module (e.g., the electrical module 208) and an energy harvester (e.g., energy harvester 212) shown in FIG. 2B are not part of the electrical device (although the electrical device may couple to the electrical module and the energy harvester). In some embodiments, the electrical device also includes the electrical module and/or the energy harvester shown in FIG. 2B are part of the electrical device.

In some embodiments, the one or more processors (e.g., processor 237) are electrically coupled with the first electrical module for receiving sensor signals from one or more sensors in the first electrical module.

In some embodiments, the electrical device includes the first electrical module (e.g., the electrical module 208) positioned on the tread region of the tire.

In some embodiments, the second bead seat region (e.g., the bead seat region 134) of the wheel is positioned opposite to the first bead seat region (e.g., the bead seat region 132) of the wheel.

In some embodiments, the wheel has an inner bead seat region (e.g., the bead seat region 132) and an outer bead seat region (e.g., the bead seat region 134), and the first bead seat region is located within the inner bead seat region and the second bead seat region is located within the outer bead seat region.

In some embodiments, the wheel has an inner bead seat region and an outer bead seat region; and the first bead seat region and the second bead seat region are located within one of: the inner bead seat region or the second bead seat region (e.g., the first bead seat region and the second bead seat region are part of a same inner or outer bead seat region).

The foregoing description, for purpose of explanation, has been described with reference to specific embodiments. However, the illustrative discussions above are not intended to be exhaustive or to limit the scope of claims to the precise forms disclosed. For example, although some of the drawings show automotive vehicles, wheels mountable on any other vehicles (e.g., airplanes) may be used. Many modifications and variations are possible in view of the above teachings. The embodiments were chosen and described in order to best explain the principles of the various described embodiments and their practical applications, to thereby enable others skilled in the art to best utilize the principles and the various described embodiments with various modifications as are suited to the particular use contemplated.

What is claimed is:

1. An electrical connector, comprising:
  a sleeve sized for mounting on a rim region of a wheel, the sleeve defining one or more channels, wherein a first side of the sleeve extends at least to a first bead seat region of the wheel;
  one or more hollow spokes mechanically coupled with the sleeve; and one or more electrical conductors, wherein at least a first electrical conductor of the one or more electrical conductors extends from a first portion of the sleeve corresponding to the first bead seat region through the one or more channels and a first hollow spoke of the one or more hollow spokes for electrically coupling with a first electrical module positioned on a first tread region of a tire mounted on the wheel.

2. The electrical connector of claim 1, wherein:
a second side of the sleeve, opposite to the first side of the sleeve, extends at least to a second bead seat region of the wheel that is opposite to the first bead seat region of the wheel; and
the one or more electrical conductors include a second electrical conductor extending from a second portion of the sleeve corresponding to the second bead seat region.

3. The electrical connector of claim 2, wherein:
the second electrical conductor extends through the one or more channels and the first hollow spoke of the one or more hollow spokes for electrically coupling with the first electrical module positioned on the first tread region of the tire mounted on the wheel.

4. The electrical connector of claim 2, wherein:
the second electrical conductor extends through the one or more channels and a second hollow spoke of the one or more hollow spokes for electrically coupling with a second electrical module positioned on a second tread region of the tire mounted on the wheel.

5. The electrical connector of claim 4, wherein:
the one or more electrical conductors include at least a third electrical conductor, distinct from the second electrical conductor, extending from the second portion of the sleeve corresponding to the second bead seat region through the one or more channels and the second hollow spoke of the one or more hollow spokes.

6. The electrical connector of claim 2, wherein:
the one or more electrical conductors include at least a fourth electrical conductor, distinct from the first electrical conductor, extending from the first portion of the sleeve corresponding to the first bead seat region through the one or more channels and the first hollow spoke of the one or more hollow spokes.

7. The electrical connector of claim 1, wherein:
the sleeve has a first surface facing the rim region and a second surface facing away from the rim region; and at least one channel is defined on the first surface of the sleeve.

8. The electrical connector of claim 1, further comprising:
a first guide positioned for coupling with the first hollow spoke and the first electrical module and for allowing the first electrical conductor to extend through the first guide to the first electrical module.

9. The electrical connector of claim 8, wherein the first guide is slidably coupled with the first hollow spoke.

10. The electrical connector of claim 1, wherein:
the one or more electrical conductors include an electrical conductor extending from a portion of the sleeve corresponding to a bead seat region of the wheel to the first electrical module along an inner surface of a tire mounted on the wheel.

11. An electrical device, comprising:
the electrical connector of claim 1; and
one or more energy harvesters, including a first energy harvester electrically coupled with the first electrical conductor.

12. The electrical device of claim 11, wherein:
the first energy harvester is mounted adjacently to the first bead seat region of the wheel.

13. The electrical device of claim 11, wherein:
the one or more energy harvesters include a second energy harvester mounted adjacently to a second bead seat region of the wheel that is opposite to the first bead seat region of the wheel.

14. The electrical device of claim 11, further comprising:
the first electrical module electrically coupled with the first electrical conductor.

15. The electrical device of claim 14, wherein:
the first electrical module includes one or more sensors.

16. The electrical device of claim 11, further comprising:
a control module mounted on the sleeve, wherein the control module includes one or more processors electrically coupled with at least one electrical conductor of the one or more electrical conductors.

17. The electrical device of claim 15, wherein:
the one or more processors are electrically coupled with the first electrical module for receiving sensor signals from one or more sensors in the first electrical module.

18. The electrical device of claim 16, wherein:
the control module includes one or more sensors.

* * * * *